(12) United States Patent
Ninz

(10) Patent No.: US 9,825,204 B2
(45) Date of Patent: Nov. 21, 2017

(54) OPTOELECTRONIC COMPONENT AND METHOD OF PRODUCTION THEREOF

(71) Applicant: OSRAM Opto Semiconductors GmbH, Regensburg (DE)

(72) Inventor: Patrick Ninz, Regensburg (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 14/917,378

(22) PCT Filed: Sep. 11, 2014

(86) PCT No.: PCT/EP2014/069437
§ 371 (c)(1),
(2) Date: Mar. 8, 2016

(87) PCT Pub. No.: WO2015/036505
PCT Pub. Date: Mar. 19, 2015

(65) Prior Publication Data
US 2016/0218249 A1 Jul. 28, 2016

(30) Foreign Application Priority Data
Sep. 13, 2013 (DE) .......... 10 2013 218 404

(51) Int. Cl.
*H01L 33/00* (2010.01)
*H01L 33/48* (2010.01)
(Continued)

(52) U.S. Cl.
CPC ........ *H01L 33/486* (2013.01); *H01L 21/4846* (2013.01); *H01L 23/544* (2013.01); *H01L 33/58* (2013.01); *H01L 33/60* (2013.01);
*H05K 1/0269* (2013.01); *H05K 1/188* (2013.01); *H01L 2223/54426* (2013.01); *H01L 2924/0002* (2013.01); *H05K 3/0008* (2013.01); *H05K 2201/09918* (2013.01); *H05K 2203/166* (2013.01)

(58) Field of Classification Search
CPC ....... H01L 2223/544; H01L 2223/5442; H01L 2223/54426; H01L 23/544; H01L 2224/9512; G03F 9/708; G03F 9/7069; G03F 9/7073; G03F 9/7076; G03F 9/7088
See application file for complete search history.

(56) References Cited

U.S. PATENT DOCUMENTS 6,628,001 B1 * 9/2003 Chittipeddi ........... H01L 23/544
257/750
8,007,286 B1 * 8/2011 Holec ...................... H01R 4/02
439/65
(Continued)

FOREIGN PATENT DOCUMENTS

EP   1 220 597 A1   7/2002

*Primary Examiner* — Syed Gheyas
(74) *Attorney, Agent, or Firm* — DLA Piper LLP (US)

(57) ABSTRACT

An optoelectronic component includes a carrier having an upper side which includes a first subarea and a second subarea, wherein the first subarea and the second subarea have different optical properties, and a method of producing an optoelectronic component includes providing a carrier having an upper side which includes a first subarea and a second subarea, and changing an optical property in the first subarea or in the second subarea.

16 Claims, 3 Drawing Sheets

(51) Int. Cl.
   *H05K 1/02* (2006.01)
   *H05K 1/18* (2006.01)
   *H01L 21/48* (2006.01)
   *H01L 23/544* (2006.01)
   *H01L 33/58* (2010.01)
   *H01L 33/60* (2010.01)
   *H05K 3/00* (2006.01)

(56) References Cited

U.S. PATENT DOCUMENTS

| | | |
|---|---|---|
| 8,476,644 B2 | 7/2013 | Illek et al. |
| 2005/0253275 A1 | 11/2005 | Hsu |
| 2009/0206411 A1* | 8/2009 | Koketsu ............... H01L 23/544 |
| | | 257/368 |
| 2011/0127912 A1* | 6/2011 | Lee ..................... F21S 48/1159 |
| | | 315/32 |
| 2011/0169164 A1* | 7/2011 | Nakamura ......... H01L 21/4857 |
| | | 257/739 |
| 2012/0070927 A1 | 3/2012 | Baur et al. |
| 2013/0141920 A1 | 6/2013 | Emerson et al. |

\* cited by examiner

OPTOELECTRONIC COMPONENT AND METHOD OF PRODUCTION THEREOF

TECHNICAL FIELD

This disclosure relates to an optoelectronic component and a method of producing an optoelectronic component.

BACKGROUND

It is known to arrange fiducial markers on carriers of optoelectronic components. Such fiducial markers are, for example, arranged on printed circuit boards or other carriers of optoelectronic components. The fiducial markers act as optical reference points for an orientation of additional components to be arranged on the carrier of the optoelectronic component. For example, the fiducial markers may act as reference points for an arrangement and orientation of optical lenses on the carrier of an optoelectronic component.

SUMMARY

I provide an optoelectronic component including a carrier having an upper side which includes a first subarea and a second subarea, wherein the first subarea and the second subarea have different optical properties.

I also provide a method of producing an optoelectronic component including providing a carrier having an upper side which includes a first subarea and a second subarea, and changing an optical property in the first subarea or in the second subarea.

LIST OF REFERENCE NUMERALS

Figure 1:
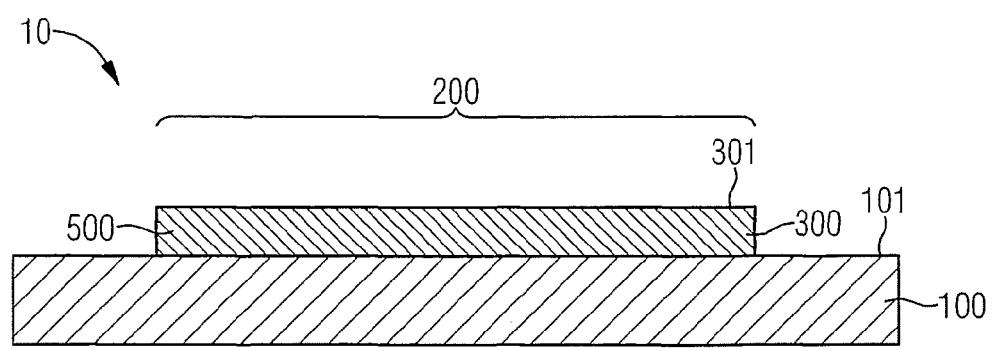
FIG. 1 shows a cut-away side view of an optoelectronic component including a carrier and a first resist arranged on an upper side of the carrier.

10 Optoelectronic component
11 Optoelectronic component
12 Optoelectronic component
13 Optoelectronic component
14 Optoelectronic component
15 Optoelectronic component
100 Carrier
101 Upper side
200 Lateral section
210 First subarea
220 Second subarea
221 Area
300 First resist
301 Surface
400 Second resist
401 Surface
500 Resist system

DETAILED DESCRIPTION

My optoelectronic component includes a carrier having an upper side comprising a first subarea and a second subarea. The first subarea and the second subarea have different optical properties. Advantageously, the second subarea on the upper side of the carrier of this optoelectronic component may act as a fiducial marker for an arrangement and orientation of components of the optoelectronic component on the upper side of the carrier. For this purpose, the position of the second subarea acting as a fiducial marker may, for example, be automatically detected using an optical detection system. Advantageously, the different optical properties of the first subarea and the second subarea of the upper side of the carrier support the automatic detection of the fiducial marker by an optical detection system.

The second subarea may be completely delimited by the first subarea. Advantageously, the second subarea acting as a fiducial marker thereby determines a position on the upper side of the carrier in all directions on the upper side of the carrier.

A resist system may be arranged in the first subarea and in the second subarea on the upper side of the carrier. In this case, the resist system has different optical properties in the first subarea and in the second subarea. The arrangement of the resist system on the upper side of the carrier and the formation of the resist system having different optical properties in the first subarea and in the second subarea makes it possible to form the fiducial marker formed by the second subarea at any position on the upper side of the carrier. Advantageously, formation of the fiducial marker may thus still be carried out after production of the carrier.

The resist system may comprise a first resist which is arranged in the first subarea and in the second subarea on the upper side of the carrier. Advantageously, in addition to its function of forming a fiducial marker, the first resist of the resist system may perform additional functions in the optoelectronic component.

The first resist may be a solder resist. Advantageously, the first resist may thereby be used to prevent wetting of the parts of the upper side of the carrier covered by the first resist with solder.

The resist system may comprise a second resist arranged in the second subarea on the first resist. The second resist may have an optical property different from that of the first resist. Advantageously, the first resist and the second resist may be selected such that the optical properties of the first subarea and the second subarea on the upper side of the carrier differ sufficiently clearly to enable automatic detection of the position of the second subarea on the upper side of the carrier.

The second subarea may be raised with respect to the first subarea in the direction perpendicular to the upper side of the carrier. This makes it possible to form the second subarea following the application of the first resist on the upper side of the carrier. As a result, production of the optoelectronic component is advantageously simplified.

The first subarea and the second subarea may have different optical reflection properties. As a result, the appearance of the first subarea differs from the appearance of the second subarea sufficiently clearly under suitable illumination to enable automatic detection of the position of the second subarea of the lateral section acting as a fiducial marker.

The first subarea and the second subarea may have different surface roughnesses. Advantageously, different optical reflection properties of the first subarea and the second subarea thereby result under suitable illumination. For example, one of the subareas may appear glossy, and the other subarea may appear dull. Advantageously, automatic detection of the position of the second subarea on the upper side of the carrier is thereby made possible with the aid of an optical detection system.

A surface of the less rough subarea may have an arithmetic mean height of less than 0.4 µm. A surface of the rougher subarea has an arithmetic mean height of more than 0.4 µm. Advantageously, I demonstrated that such differences in the arithmetic mean height on the surfaces of the first subarea and the second subarea produce sufficiently different optical reflection properties of the first subarea and the second subarea under suitable illumination to enable an automatic detection of the position of the second subarea on the surface of the carrier using an optical detection system.

The second subarea may have an area of 500 µm$^2$ to 250,000 µm$^2$. Advantageously, the second subarea on the upper side of the carrier acting as a fiducial marker thus determines a position on the upper side of the carrier with high accuracy and thus has a size sufficient for automated detection of the second subarea.

The first subarea and the second subarea may have essentially identical colors in the optical spectral range. For example, the first subarea and the second subarea may both have an essentially white color. Advantageously, the first subarea and the second subarea thereby have an essentially uniform appearance under normal viewing with the naked eye. An unequal light loss in the lateral section on the upper side of the carrier of the optoelectronic component may thereby also be prevented.

An optoelectronic semiconductor chip may be arranged on the carrier. Advantageously, the optoelectronic semiconductor chip may be oriented toward the fiducial marker formed by the second subarea during the production of this optoelectronic component. This advantageously enables precise placement of the optoelectronic semiconductor chip on the carrier of the optoelectronic component.

My method of producing an optoelectronic component comprises providing a carrier having an upper side comprising a first subarea and a second subarea, and changing an optical property in the first subarea or in the second subarea. Advantageously, the second subarea of the optoelectronic component obtainable via this method may be used as a fiducial marker for an arrangement and orientation of components of the optoelectronic component on the upper side of the carrier. The second subarea acting as a fiducial marker thus enables automatic detection of its position with the aid of an optical detection system. The automatic detection is enabled via the different optical properties of the first subarea and the second subarea on the upper side of the carrier.

This method may include an additional step of arranging a resist system in the first subarea and in the second subarea of the upper side of the carrier. Advantageously, the different optical properties may then be formed in the resist system on the upper side of the carrier, which advantageously enables a flexible placement of the fiducial marker formed by the second subarea.

The resist system may comprise a first resist arranged in the first subarea and in the second subarea on the upper side of the carrier. In addition to its function of having different optical properties in the first subarea and in the second subarea, the first resist may perform further functions.

A second resist may be arranged on the first resist in the second subarea. The second resist may have an optical property different from that of the first resist. Advantageously, different optical properties of the first subarea and the second subarea are thereby obtained in a simple manner on the upper side of the carrier.

The first resist may be roughened in the first subarea or in the second subarea. Advantageously, the first subarea and the second subarea of the optoelectronic component obtainable via this method thereby have different surface roughnesses, thus resulting in different optical reflection properties of the first subarea and the second subarea on the upper side of the carrier of the optoelectronic component obtainable via this method. This facilitates an automatic detection of the second subarea on the upper side of the carrier of the optoelectronic component acting as a fiducial marker.

Roughening of the first resist may be carried out via a laser treatment, etching, or grinding. Advantageously, the method thereby enables an effective increase in the surface roughness of the first resist in the first subarea or in the second subarea.

The first resist in the first subarea or in the second subarea may be smoothed. Smoothing the first resist may, for example, be carried out via polishing. Advantageously, the first subarea and the second subarea of the optoelectronic component obtainable via this method thereby have different surface roughnesses, thus resulting in different optical reflection properties of the first subarea and the second subarea on the upper side of the carrier of the optoelectronic component obtainable via this method. This facilitates an automatic detection of the second subarea on the upper side of the carrier of the optoelectronic component acting as a fiducial marker.

The characteristics, features and advantages described above, as well as the manner in which they are achieved, will be more clearly and explicitly understandable in connection with the following description of examples explained in greater detail in connection with the drawings. Each of the following figures is shown in a schematic representation.

Figure 2:
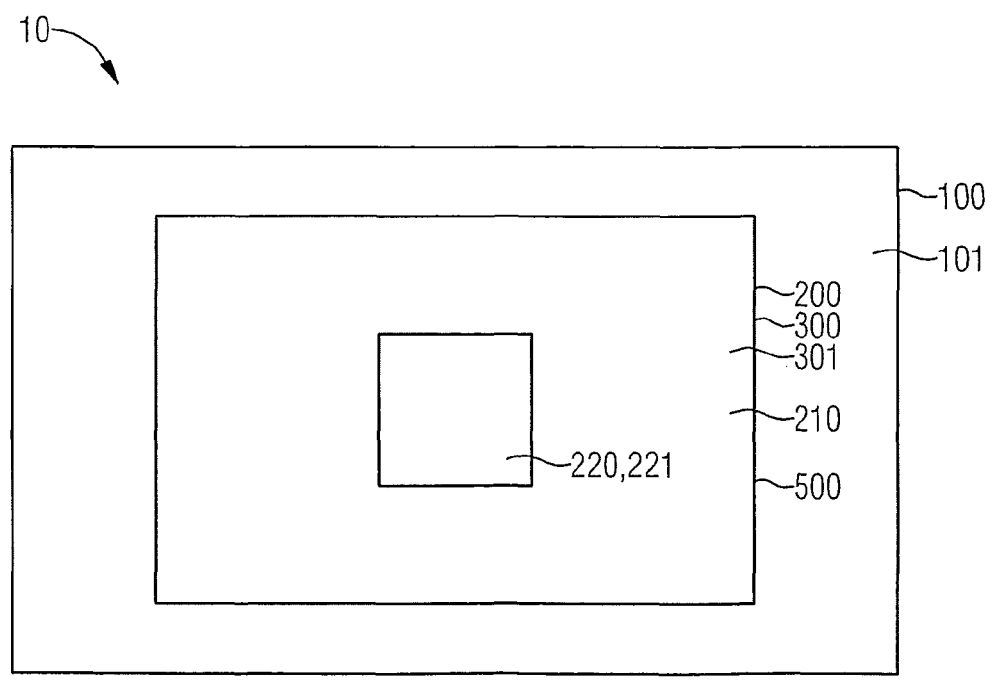
FIG. 2 shows a top view onto the upper side of the carrier of the optoelectronic component.

FIG. 1 shows a schematic cut-away side view of an optoelectronic component 10 in an unfinished processing state. FIG. 2 shows a schematic top view onto the optoelectronic component 10 in the processing state depicted in FIG. 1. The optoelectronic component 10 may, for example, be a light-emitting diode component, a laser component, or another optoelectronic component.

The optoelectronic component 10 includes a carrier 100. The carrier 100 is disk-shaped and has an essentially flat upper side 101. The carrier 100 may, for example, be formed as a printed circuit board (PCB).

The carrier 100 of the optoelectronic component 10 is provided to support components of the optoelectronic component 10 and, if necessary, to provide electrical contacts for the components of the optoelectronic component 10. For this purpose, the components of the optoelectronic component 10 may be arranged on the upper side 101 of the carrier 100. The components of the optoelectronic component 10 may, for example, be attached to the upper side 101 of the carrier 100 via gluing or soldering. The components arranged on the upper side 101 of the carrier 100 may, for example, be optoelectronic semiconductor chips and optical components, for example, optical lenses.

To attach and electrically contact electronic components of the optoelectronic component 10, electrical contact pads not depicted in FIGS. 1 and 2 may be formed on the upper side 101 of the carrier 100 of the optoelectronic component 10. These electrical contact pads may, for example, be formed as solder contact pads.

Arrangement of the components of the optoelectronic component 10 on the upper side 101 of the carrier 100 may require precise positioning of the components of the optoelectronic component 10 on target positions provided on the upper side 101 of the carrier 100, as well as an exact relative orientation of the components of the optoelectronic component 10 with respect to each other. For example, it may be required to orient an optical lens of the optoelectronic component 10 precisely on a radiation emission surface of a light-emitting diode (LED) chip of the optoelectronic component 10.

To facilitate orientation of the components of the optoelectronic component 10 on the upper side 101 of the carrier 100, one or multiple fiducial markers must be formed on the upper side 101 of the carrier 100. The fiducial markers are to have specified positions on the upper side 101 of the carrier 100. The components of the optoelectronic component 10 to be arranged on the upper side 101 of the carrier 100 are subsequently oriented toward the fiducial markers and thereby also assume specified positions relative to one another.

A fiducial marker is to be formed in a lateral section 200 of the upper side 101 of the carrier 100, which is apparent in the schematic top view of FIG. 2. The lateral section 200 comprises a first subarea 210 and a second subarea 220. The second subarea 220 of the lateral section 200 is to form a fiducial marker. Preferably, the second subarea 220 of the lateral section 200 is completely delimited by the first subarea 210 of the lateral section 200 as depicted in FIG. 2.

In the depiction of FIG. 2, the second subarea 220 of the lateral section 200 has a rectangular shape. However, the second subarea 220 can also have a different shape suitable for a fiducial marker, for example, a cross shape, a circular disk shape, a ring shape, a rectangular shape with rounded corners, or an angular shape. The second subarea 220 could also, for example, be made up of two rectangles whose corners meet.

The second subarea 220 may, for example, have an edge length of 100 µm to 500 µm. The second subarea 220 of the lateral section 200 may have an area 221 which, for example, is 500 µm² to 250,000 µm².

A resist system 500 is arranged on the upper side 101 of the carrier 100 in the lateral section 200 of the upper side 101 of the carrier 100. In the depicted example, the resist system 500 comprises only a first resist 300. However, the resist system 500 can also comprise more than only the first resist 300, for example, additional resist layers arranged below or above the first resist 300. Preferably, the lateral section 200 of the upper side 101 of the carrier 100 is completely covered by the first resist 300. The upper side 101 of the carrier 100 may also be covered by the first resist 300 in areas outside the lateral section 200.

The first resist 300 may, for example, be a solder resist provided to limit a lateral spreading of a solder used on the upper side 101 of the carrier 100 to a desired area, during an establishment of a solder connection between a component of the optoelectronic component 10 and a solder contact arranged on the upper side 101 of the carrier 100 of the optoelectronic component 10. The first resist 300 may, for example, be based on an epoxy or an epoxy acrylate. The first resist 300 may, for example, be a photolithographically structurable resist.

The first resist 300 may, for example, have a white color. In the completely processed optoelectronic component 10, it may be provided that the first resist 300 remains on the upper side 101 of the carrier 100 and forms a portion of a reflecting outer side of the optoelectronic component 10.

For the arrangement and orientation of the components of the optoelectronic component 10 on the upper side 101 of the carrier 100, it is necessary that the second subarea 220 of the lateral section 200 forming the fiducial marker is able to be differentiated from the first subarea 210 of the lateral section 200. The position of the second subarea 220 of the lateral section 200 may then be detected. Preferably, the position of the second subarea 220 of the lateral section 200 should be detectable via an automatic detection system, for example, an automatic image processing system.

However, the first subarea 210 and the second subarea 220 of the lateral section 200 should simultaneously differ as little as possible and should preferably essentially appear to have the same color when viewed with the naked eye and under normal illumination conditions.

To fulfill these requirements, the first subarea 210 and/or the second subarea 220 of the lateral section 200 are processed such that the first subarea 210 and the second subarea 220 of the lateral section 200 have different optical properties. In particular, an optical reflection property of the first subarea 210 and/or the second subarea 220 of the lateral section 200 may be changed. This may, for example, be achieved in that the first subarea 210 and/or the second subarea 220 are processed such that the first subarea 210 and the second subarea 220 have different surface roughnesses.

Various optoelectronic components obtainable via further processing of the optoelectronic component 10 of FIGS. 1 and 2 are explained below based on FIGS. 3 to 6. The same reference numerals as in FIGS. 1 and 2 are used for identical and identically acting components.

Figure 3:
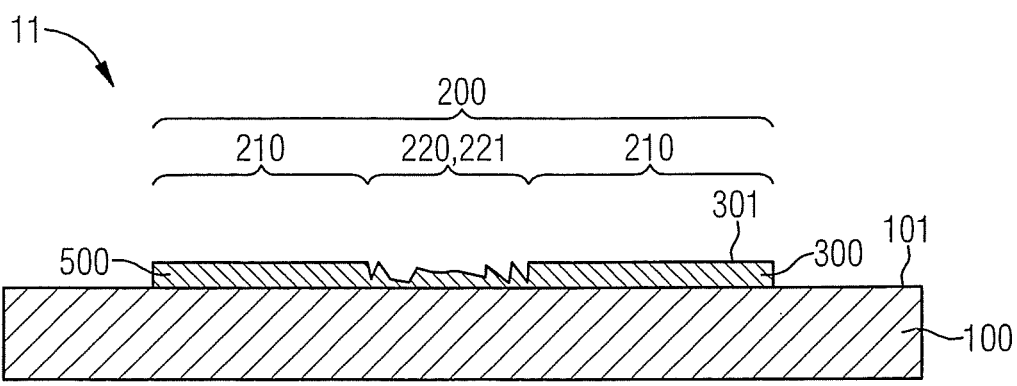
FIG. 3 shows a cut-away side view of a first optoelectronic component.

FIG. 3 shows a schematic cut-away side view of an optoelectronic component 11. In the optoelectronic component 11, a surface 301 of the first resist 300 has a higher roughness in the second subarea 220 of the lateral section 200 than in the first subarea 210 of the lateral section 200. The surface 301 of the first resist 300 may, for example, have an arithmetic mean height of less than 0.4 µm in the first subarea 210. In the second subarea 220 of the lateral section 200, the surface 301 of the first resist 300 may, for example, have an arithmetic mean height of more than 0.4 µm.

The increased roughness of the surface 301 of the first resist 300 in the second subarea 220 of the lateral section 200 may have been produced via roughening of the first resist 300 in the second subarea 220 following the application of the first resist 300 to the upper side 301 of the carrier 100. The roughening of the surface 301 of the first resist 300 in the second subarea 220 of the lateral section 200 may, for example, have been carried out via a laser treatment, etching, or grinding.

Alternatively or additionally, the surface 301 of the first resist 300 in the first subarea 210 of the lateral section 200 may have been smoothed following application of the first resist 300 to the upper side 101 of the carrier 100. Smoothing the surface 301 of the first resist 300 in the first subarea 210 of the lateral section 200 may, for example, have been carried out via polishing.

Figure 4:
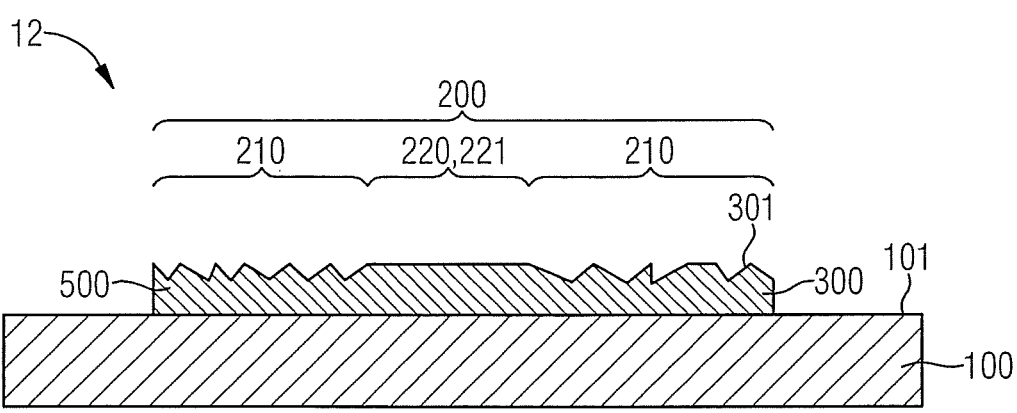
FIG. 4 shows a cut-away side view of a second optoelectronic component.

FIG. 4 shows a schematic cut-away side view of an optoelectronic component 12. The surface 301 of the first resist 300 has a higher roughness in the first subarea 210 of the lateral section 200 than in the second subarea 220 of the lateral section 200. For example, the surface 301 of the first resist 300 in the first subarea 210 of the lateral section 200 may have an arithmetic mean height of more than 0.4 µm. In the second subarea 220 of the lateral section 200, the surface 301 of the first resist 300 may, for example, have an arithmetic mean height of less than 0.4 μm.

The different roughnesses of the surface 301 of the first resist 300 in the first subarea 210 and in the second subarea 220 of the lateral section 200 may, for example, have been produced via roughening of the surface 301 of the first resist 300 in the first subarea 210 of the lateral section 200 following the application of the first resist 300 on the upper side 301 of the carrier 100. Roughening the surface 301 of the first resist 300 in the first subarea 210 of the lateral section 200 may, for example, have been carried out via a laser treatment, etching, or grinding.

The different roughnesses of the surface 301 of the first resist 300 in the first subarea 210 and in the second subarea 220 of the lateral section 200 may alternatively or additionally also have been produced via a smoothing of the surface 301 of the first resist 300 in the second subarea 220 of the lateral section 200. The smoothing of the surface 301 of the first resist 300 in the second subarea 220 of the lateral section 200 may, for example, have been carried out via polishing.

Figure 5:
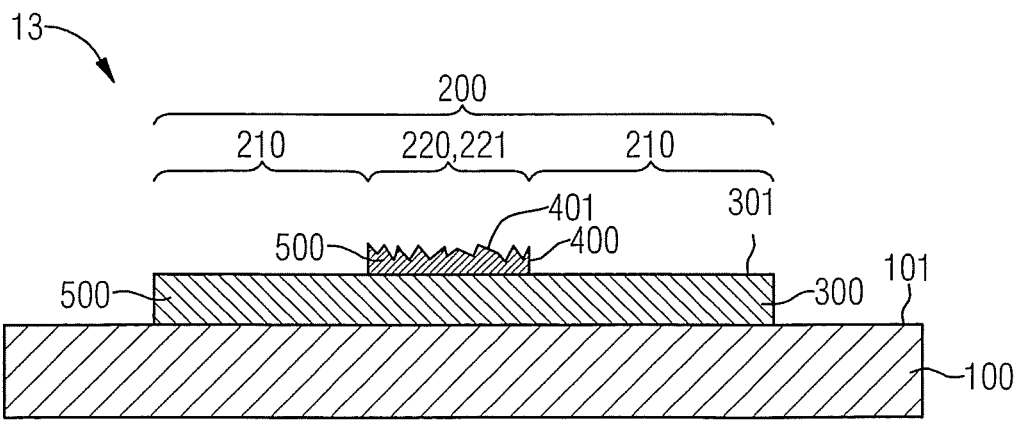
FIG. 5 shows a cut-away side view of a third optoelectronic component.

FIG. 5 shows a schematic cut-away side view of an optoelectronic component 13. A second resist 400 is arranged above the first resist 300 in the second subarea 220 of the lateral section 200 on the upper side 101 of the carrier 100. The resist system 500 arranged in the lateral section 200 of the upper side 101 of the carrier 100 on the upper side 101 of the carrier 100 thus comprises both the first resist 300 and the second resist 400. In the first subarea 210 of the lateral section 200, the first resist 300 is not covered by the second resist 400. The second resist 400 may, for example, be a solder resist.

The second resist 400 has a surface 401 having a higher roughness than the surface 301 of the first resist 300 in the first subarea 210 of the lateral section 200. For example, the surface 401 of the second resist 400 in the second subarea 220 of the lateral section 200 may have an arithmetic mean height of more than 0.4 μm. The surface 301 of the first resist 300 in the first subarea 210 of the lateral section 200 may, for example, have an arithmetic mean height of less than 0.4 μm.

The second resist 400 may have been arranged on the surface 301 of the first resist 300, for example, via a screen, stencil, or pad printing method. The second resist 400 may also have been arranged in the second subarea 220 of the lateral section 200 on the surface 301 of the first resist 300 via a photolithographic method.

The first resist 300 and the second resist 400 preferably have essentially identical colors. In particular, the first resist 300 and the second resist 400 preferably have essentially identical colors in the visible spectral range. However, in the optoelectronic component 13, the second resist 400 has a higher surface roughness than the first resist 300. The second resist 400 may, for example, be a dull resist, while the first resist 300 may be a glossy resist.

Figure 6:
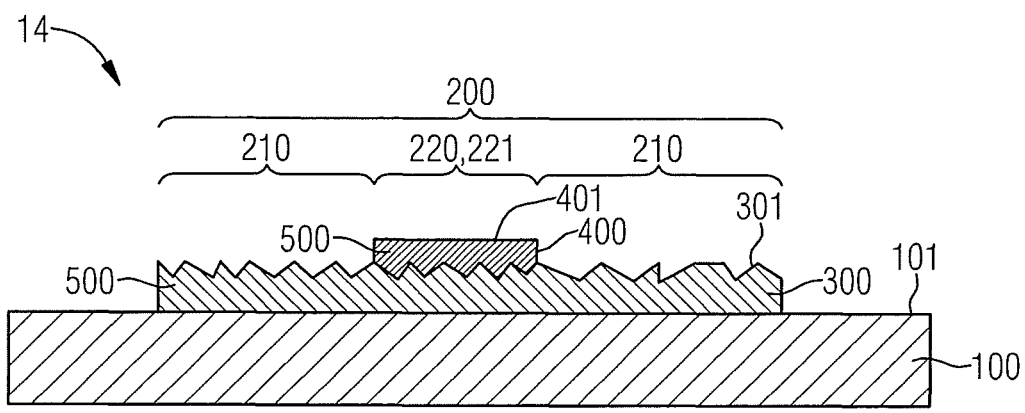
FIG. 6 shows a cut-away side view of a fourth optoelectronic component.

FIG. 6 shows a schematic cut-away side view of an optoelectronic component 14. A second resist 400 is also arranged on the surface 301 of the first resist 300 in the second subarea 220 of the lateral section 200. In the first subarea 210 of the lateral section 200, the first resist 300 is not covered by the second resist 400. The second resist 400 may, for example, be a solder resist. The resist system 500 arranged in the lateral section 200 of the upper side 101 of the carrier 100 on the upper side 101 of the carrier 100 thus also comprises both the first resist 300 and the second resist 400.

The surface 401 of the second resist 400 in the second subarea 220 of the lateral section 200 has a lower roughness than the surface 301 of the first resist 300 in the first subarea 210 of the lateral section 200. For example, the surface 401 of the second resist 400 in the second subarea 220 of the lateral section 200 may have an arithmetic mean height of less than 0.4 μm. The surface 301 of the first resist 300 in the first subarea 210 of the lateral section 200 may, for example, have an arithmetic mean height of more than 0.4 μm.

In the optoelectronic component 14, the second resist 400 may, for example, have been arranged in the second subarea 220 of the lateral section 200 on the surface 301 of the first resist 300 via a screen, stencil, or pad printing method, or via a photolithographic method.

In the optoelectronic component 14, the first resist 300 and the second resist 400 preferably have essentially identical colors. In particular, the first resist 300 and the second resist 400 preferably have identical colors in the optical spectral range. The first resist 300 may, for example, be a dull resist. In the optoelectronic component 14, the second resist 400 may, for example, be a glossy resist.

Figure 7:
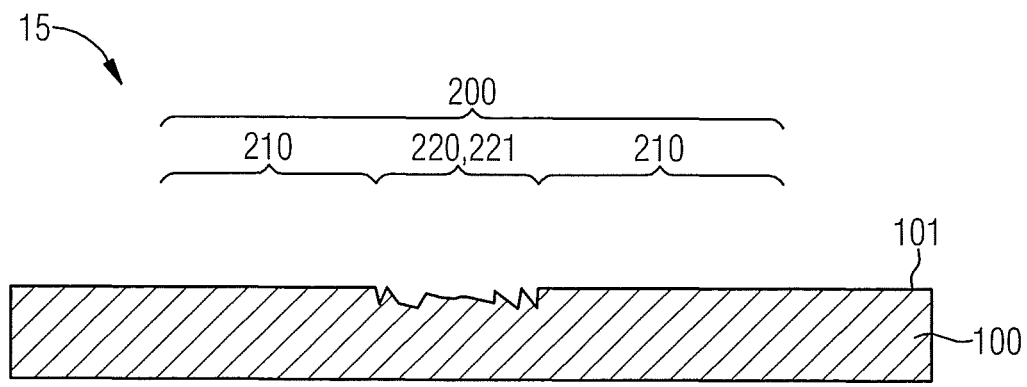
FIG. 7 shows another cut-away side view of a fourth optoelectronic component.

FIG. 7 shows a schematic cut-away side view of an optoelectronic component 15. The optoelectronic component 15 differs from the optoelectronic components 11, 12, 13 and 14 of FIGS. 3 to 6 in that no resist system is arranged on the upper side 101 of the carrier 100 of the optoelectronic component 15. Instead, in the optoelectronic component 15, the upper side 101 of the carrier 100 itself has different optical properties in the first subarea 210 and in the second subarea 220.

In the example of the optoelectronic component 15 depicted in FIG. 7, the upper side 101 of the carrier 100 has a higher roughness in the second subarea 220 than in the first subarea 210. For example, the upper side 101 of the carrier 100 may have an arithmetic mean height of more than 0.4 μm in the second subarea 220. The upper side 101 of the carrier 100, for example, may have an arithmetic mean height of less than 0.4 μm in the first subarea 210 of the upper side 101 of the carrier 100.

The higher roughness of the upper side 101 of the carrier 100 in the second subarea 220 of the upper side 101 of the carrier 100 may, for example, have been produced by roughening the upper side 101 of the carrier 100 in the second subarea 220. The roughening of the upper side 101 of the carrier 100 in the second subarea 220 may, for example, have been carried out via a laser treatment, etching, or grinding. Alternatively or additionally, the lower roughness of the first subarea 210 of the upper side 101 of the carrier 100 compared to the roughness of the second subarea 220 may have been produced via smoothing of the upper side 101 of the carrier 100 in the first subarea 210. The smoothing of the upper side 101 of the carrier 100 in the first subarea 210 may have been carried out, for example, via polishing.

In an additional optoelectronic component not depicted in the figures, the upper side 101 of the carrier 100 has a higher roughness in the first subarea 210 than in the second subarea 220.

In each of the optoelectronic components 11, 12, 13, 14, 15 of FIGS. 3 to 7, the first subarea 210 and the second subarea 220 of the lateral section 200 have different surface roughnesses. The first subarea 210 and the second subarea 220 of the lateral section 200 may thereby be differentiated from each other under suitable illumination conditions and suitable viewing conditions. Thus, in the optoelectronic components 11, 12, 13, 14, the second subarea 220 of the lateral section 200 may act as a fiducial marker in each case.

The suitable illumination conditions to differentiate the first subarea 210 and the second subarea 220 of the lateral section 200 may, for example, comprise irradiation of light from a specified irradiation device and having a specified light color. For example, the upper side 101 of the carrier 100 may be illuminated at grazing incidence for differentiating the first subarea 210 and the second subarea 220 of the lateral section 200.

The suitable observation conditions for differentiating the first subarea 210 and the second subarea 220 of the lateral section 200 may comprise viewing from the perpendicular direction or from a direction which is at an angle to the upper side 101 of the carrier 100.

It is also possible to form the first subarea 210 and the second subarea 220 of the lateral section 200 such that the first subarea 210 and the second subarea 220 of the lateral section 200 have essentially identical colors in the visible spectral range, but have high contrasts in the infrared spectral range and/or in the ultraviolet spectral range. This may be achieved in that, for example, a second resist 400, which has a different color than the first resist 300 in the infrared and/or the ultraviolet spectral range, is applied to the first resist 300 in the second subarea 220 of the lateral section 200.

Furthermore, it is possible to form the first subarea 210 and the second subarea 220 of the lateral section 200 such that the first subarea 210 or the second subarea 220 of the lateral section 200 reacts in a photoluminescent manner under suitable excitation. For this purpose, for example, a second resist 400, which reacts in a photoluminescent manner under suitable excitation, may be applied to the surface 301 of the first resist 300 in the second subarea 220 of the lateral section 200.

My components and methods are illustrated and described in greater detail based on the preferred examples. However, this disclosure is not limited to the described examples. Rather, other variations may be derived from them by those skilled in the art without departing from the scope of protection of the appended claims.

The invention claimed is:

1. An optoelectronic component comprising a carrier having an upper side which comprises a first subarea and a second subarea, wherein the first subarea and the second subarea have different optical properties, a resist system is arranged in the first subarea and in the second subarea on the upper side of the carrier, and the resist system has different optical properties in the first subarea and in the second subarea.

2. The optoelectronic component as claimed in claim 1, wherein the second subarea is completely delimited by the first subarea.

3. The optoelectronic component as claimed in claim 1, wherein the resist system comprises a first resist arranged in the first subarea and in the second subarea on the upper side of the carrier.

4. The optoelectronic component as claimed in claim 3, wherein the first resist is a solder resist.

5. The optoelectronic component as claimed in claim 4, wherein the resist system comprises a second resist arranged in the second subarea on the first resist.

6. The optoelectronic component as claimed in claim 1, wherein the second subarea is raised with respect to the first subarea in a direction perpendicular to the upper side of the carrier.

7. The optoelectronic component as claimed in claim 1, wherein an optoelectronic semiconductor chip is arranged on the carrier.

8. The optoelectronic component as claimed in claim 1, wherein the first subarea and the second subarea have essentially identical colors in the optical spectral range.

9. The optoelectronic component as claimed in claim 1, wherein the first subarea and the second subarea have different optical reflection properties.

10. An optoelectronic component comprising a carrier having an upper side which comprises a first subarea and a second subarea, wherein the first subarea and the second subarea have different optical properties, the first subarea and the second subarea have different surface roughnesses, a surface of the less rough subarea has an arithmetic mean height of less than 0.4 µm, and a surface of the rougher subarea has an arithmetic mean height of more than 0.4 µm.

11. The optoelectronic component as claimed in claim 10, wherein the second subarea has an area of 500 µm$^2$ to 250,000 µm$^2$.

12. The optoelectronic component as claimed in claim 10, wherein the first subarea and the second subarea have essentially identical colors in the optical spectral range.

13. A method of producing an optoelectronic component comprising:
   providing a carrier having an upper side which comprises a first subarea and a second subarea;
      changing an optical property in the first subarea or in the second subarea;
      arranging a resist system in the first subarea and in the second subarea on the upper side, wherein the resist system comprises a first resist arranged in the first subarea and in the second subarea on the upper side of the carrier; and
      a second resist is arranged in the second subarea on the first resist.

14. A method of producing an optoelectronic component comprising:
   providing a carrier having an upper side which comprises a first subarea and a second subarea;
      changing an optical property in the first subarea or in the second subarea; and
      arranging a resist system in the first subarea and in the second subarea on the upper side, wherein the resist system comprises a first resist arranged in the first subarea and in the second subarea on the upper side of the carrier, and wherein the first resist is roughened in the first subarea or in the second subarea.

15. The method as claimed in claim 14, wherein roughening of the first resist is carried out via a laser treatment, etching, or grinding.

16. A method of producing an optoelectronic component comprising:
   providing a carrier having an upper side which comprises a first subarea and a second subarea;
      changing an optical property in the first subarea or in the second subarea; and
      arranging a resist system in the first subarea and in the second subarea on the upper side, wherein the resist system comprises a first resist arranged in the first subarea and in the second subarea on the upper side of the carrier, and wherein the first resist is smoothed in the first subarea or in the second subarea.

* * * * *